(12) United States Patent
Shinde et al.

(10) Patent No.: US 11,671,094 B1
(45) Date of Patent: Jun. 6, 2023

(54) DRIVER CIRCUIT

(71) Applicant: Dialog Semiconductor (UK) Limited, London (GB)

(72) Inventors: Suhas Vishwasrao Shinde, Germering (DE); Stephan Drebinger, Munich (DE); Marcus Weis, Munich (DE)

(73) Assignee: Dialog Semiconductor (UK) Limited, London (GB)

( * ) Notice: Subject to any disclaimer, the term of this patent is extended or adjusted under 35 U.S.C. 154(b) by 45 days.

(21) Appl. No.: 17/145,764

(22) Filed: Jan. 11, 2021

(51) Int. Cl.
*H03K 17/687* (2006.01)

(52) U.S. Cl.
CPC . *H03K 17/6872* (2013.01); *H03K 2217/0063* (2013.01); *H03K 2217/0072* (2013.01)

(58) Field of Classification Search
CPC .. H03K 17/68; H03K 17/687; H03K 17/6872; H03K 17/6871; H03K 2217/0063; H03K 2217/0072
USPC .................................................. 327/108–112
See application file for complete search history.

(56) References Cited

U.S. PATENT DOCUMENTS

| | | | |
|---|---|---|---|
| 7,652,601 B2 * | 1/2010 | Patterson | H03M 1/164 327/108 |
| 8,674,765 B2 | 3/2014 | Mengad | |
| 10,158,288 B2 | 12/2018 | Mengad | |

OTHER PUBLICATIONS

"Embedded 5 V-to-3.3 V Voltage Regulator for Supplying Digital IC's in 3.3 V CMOS Technology," by Gerrit W. Den Besten et al., IEEE Journal of Solid-State Circuits, vol. 33, No. 7, Jul. 1998, pp. 956-962.
"Area-Efficient Linear Regulator With Ultra-Fast Load Regulation," by Peter Hazucha et al., IEEE Journal of Solid-State Circuits, vol. 40, No. 4, Apr. 2005, pp. 933-940.
MIPI Alliance Specification for System Power Management Interface (SPMI), Version 2.0—Mar. 14, 2012, Copyright 2012 MIPI Alliance, Aug. 30, 2012, 91 pages.
"Ultra-fast cap-less LDO for dual lane USB in 28FDSOI," by Saurabh Kumar et al., 2015 28th International Conference on VLSI Design and 2015 14th International Conference on Embedded Systems, Jan. 3-7, 2015, pp. 254-259.

* cited by examiner

*Primary Examiner* — Tomi Skibinski
(74) *Attorney, Agent, or Firm* — Saile Ackerman LLC; Stephen B. Ackerman

(57) ABSTRACT

Driver circuits to invert an input signal and to generate an output signal based on the inverted input signal are presented. The voltage level of the logical high value of the output signal is adjustable. The driver circuit has a high side switching element coupled between a supply terminal and the output terminal of the driver circuit. The driver circuit has a low side switching element coupled between the output terminal of the driver circuit and a reference potential. The driver circuit has a regulation transistor, wherein a controlled section of the regulation transistor is coupled in series with the high side switching element and the low side switching element between the supply terminal and the reference potential. The driver circuit has a feedback circuit to regulate the output voltage by generating a regulation voltage at a control terminal of the regulation transistor.

26 Claims, 8 Drawing Sheets

DRIVER CIRCUIT

TECHNICAL FIELD

The present document relates to driver circuits. In particular, the present document relates to driver circuits configured to invert an input signal and generate an output signal based on the inverted input signal, wherein a voltage level of the logical high value of the output signal is adjustable.

BACKGROUND

In recent years, fully on-chip capacitor or capacitor less linear drop out (LDO) regulators have become an active area of research. These architectures are often necessary to achieve a higher level of integration. In a Power Management Integrated Chip (PMIC), one of the challenges in high level of integration is dedicated internal supply rails driven by LDOs which use on-chip capacitors. The required capacitors for LDO regulators are large, in hundreds of Picofarads, consuming significant amount of silicon real estate. Some LDOs use off-chip capacitors for better load transient performance. However, this costs board area. A PMIC typically requires 1.2V, 1.8V internal supply rails for digital IOs like General Purpose Input/Output (GPIO), System Power Management Interface (SPMI), etc. These supply voltages are generated by regulators which consume large area due to on-chip output capacitors. The CMOS driver switching/peak current is in the orders of tens of Milliamperes. A capacitor less regulator cannot meet the required load transient performance and hence is a bad choice.

SUMMARY

The present document addresses the above-mentioned technical problems. Specifically, the present document addresses the technical problem of providing a driver circuit which requires neither a conventional LDO regulator nor large capacitors. Thus, it may be seen as an objective of the present document to provide a novel driver circuit which reduced area/size.

According to an aspect, a driver circuit is presented. The driver circuit may be configured to generate an output voltage at an output terminal of the driver circuit. The driver circuit may comprise a high side switching element coupled between a supply terminal and the output terminal of the driver circuit. The driver circuit may comprise a low side switching element coupled between the output terminal of the driver circuit and a reference potential. The driver circuit may comprise a regulation transistor, wherein a controlled section of the regulation transistor is coupled in series with the high side switching element and the low side switching element between the supply terminal and the reference potential. The driver circuit may comprise a feedback circuit configured to regulate the output voltage by generating a regulation voltage at a control terminal of the regulation transistor.

The switching elements may be implemented with any suitable devices, such as, for example, metal-oxide-semiconductor field effect transistors (MOSFETs), insulated-gate bipolar transistors (IGBTs), MOS-gated thyristors, or other suitable power devices. For example, the high side switching element may be a p-type MOSFET, and the low side switching element may be an n-type MOSFET. A source of the high-side element may be connected to the supply terminal, and a source of the low side switching element may be connected to the reference potential. The drain-source channel of the high side switching element may be coupled between the supply terminal and the output terminal, and the drain-source channel of the low-side switching element may be coupled between the output terminal and the reference potential. Each switching element may have a control terminal (e.g. a gate) to which a respective control signal or driving voltage may be applied to turn the switching element on (i.e. to close the switching element) or to turn the switching element off (i.e. to open the switching element).

Throughout this document, the term "reference potential" is meant in its broadest possible sense. In particular, the reference potential is not limited to ground i.e. a reference potential with a direct physical connection to earth or a voltage of 0V. Rather, the term "reference potential" may refer to any reference point to which and from which electrical currents may flow or from which voltages may be measured. Moreover, it should be mentioned that the reference potentials mentioned in this document may not necessarily refer to the same physical contact. Instead, the reference potentials mentioned in this document may relate to different physical contacts although reference is made to "the" reference potential for ease of presentation.

The regulation transistor may be a MOSFET, and the controlled section of the regulation transistor may be the drain-source channel of the MOSFET. In contrast to the switching elements, the regulation transistor may not be operated as an on/off-switch, but may be operated in a linear mode of operation (also known as current saturation region), wherein the drain-source current of the regulation transistor is almost independent of the drain-source voltage, and directly depends on the gate-source voltage. In other words, a resistance of the drain-source channel of the regulation transistor may be continuously controlled based on the regulation voltage at the control terminal of the regulation transistor. In this way, the output voltage at the output terminal may be regulated using the regulation transistor. As will be discussed throughout this document, the regulation transistor may be used in a source follower configuration.

The regulation transistor may be e.g. an n-type MOSFET, and the drain-source channel of the regulation transistor may be coupled in series with the high side switching element between the supply terminal and the output terminal of the driver circuit. Alternatively or additionally, the regulation transistor may be a p-type MOSFET, and a drain-source channel of the regulation transistor may be coupled in series with the low side switching element between the output terminal of the driver circuit and the reference potential. In particular, the controlled section of the regulation transistor may be coupled between the high side switching element and the output terminal of the driver circuit. Alternatively or additionally, the controlled section of the regulation transistor may be coupled between the output terminal of the driver circuit and the low side switching element.

An input voltage of the driver circuit may be applied to both a control terminal of the high side switching element and to a control terminal of the low side switching element. In general, the input voltage may represent a binary input signal which may either have a logical high value or a logical low value. In particular, the input voltage may either have a signal value corresponding to an input supply voltage or a signal value corresponding to an input reference voltage (which may be e.g. =0V). Likewise, the output voltage may represent a binary output signal which may either have a logical high value or a logical low value. The driver circuit may be seen as an inverter circuit configured to generate the binary output signal as an inverted version of the binary input signal.

On the one hand, the output signal may have its logical low value when the low side switching element is turned on and when the high side switching element is turned off. In this scenario, the output voltage may be drawn to the reference potential i.e. the logical low value of the output signal may correspond to the reference potential. On the other hand, the output signal may have its logical high value when the high side switching element is turned on and when the low side switching element is turned off. In this scenario, in the absence of the described regulation transistor, the output voltage would be drawn to the supply voltage of the supply terminal i.e. the logical high value of the output signal would correspond to said supply voltage. If, however, the regulation transistor is coupled between the supply terminal and the output terminal of the driver circuit, the output voltage representing the output signal may be given as the supply voltage at the supply terminal which is limited/reduced by the voltage drop across the regulation transistor. As a result, the regulation transistor may limit the output voltage to a level below the supply voltage. In other words, the feedback circuit together with the regulation capacitor may be configured to regulate the output voltage when the high side switching element is turned on. For example, the feedback circuit together may be configured to regulate the output voltage only when the high side switching element is turned on. Thus, the driver circuit is capable of adjusting/regulating the output voltage corresponding to the logical high value of the output signal to different voltage levels. In this way, the driver circuit is adjustable to drive at its output electronic circuits with different output voltage domains.

The feedback circuit may comprise a replica transistor, wherein a controlled section of the replica transistor is coupled between the supply terminal and a replica output terminal. The feedback circuit may comprise an error amplifier configured to generate an error voltage by comparing a voltage at the replica output terminal with a reference voltage.

Subsequently, the error voltage may be applied to a control terminal of the replica transistor. The control terminal of the replica transistor may be connected to the control terminal of the regulation transistor. Thus, the error voltage may be applied to the control terminals of both the replica transistor and the regulation transistor, and both transistors may be in a source follower configuration.

The replica transistor may have the same geometry as the regulation transistor. Specifically, a gate length and a gate width of both transistors may be identical. And more specifically, the replica transistor may be identical to the regulation transistor.

The driver circuit may further comprise a current source coupled between the output terminal of the driver circuit and the reference potential. The feedback circuit may further comprise a replica current source coupled between the replica output terminal and the reference potential. The current source may be configured to sink a current from the output terminal of the driver circuit. The replica current source may be configured to sink a replica current from the replica output terminal. The current may be equal to the replica current. By sinking the same current from the output terminal and the replica output terminal, it becomes possible to generate corresponding voltage drops across the controlled section of the replica transistor and the controlled section of the regulation transistor. Therefore, the replica transistor undergoes the same parameter variations as the regulation driver with respect to process, temperature, supply, and bias conditions. As a result, the latter variations may be successfully compensated with the help of the replica transistor and the replica current source.

The feedback circuit may further comprise a compensation capacitor coupled between the control terminal of the regulation transistor and a reference potential.

The feedback circuit may further comprise a diode-connected transistor whose control terminal is connected to the control terminal of the regulation transistor. The feedback circuit may further comprise a current regulation transistor coupled in series with the diode-connected transistor between the supply terminal and the reference potential. The error voltage may be applied to a control terminal of the current regulation transistor. To be more specific, a controlled section of the current regulation transistor may be coupled in series with a controlled section of the diode-connected transistor.

The feedback circuit may further comprise a replica diode-connected transistor whose control terminal is connected to the control terminal of the replica regulation transistor. The feedback circuit may further comprise a replica current regulation transistor coupled in series with the replica diode-connected transistor between the supply terminal and the reference potential. Again, the error voltage may be applied to a control terminal of the replica current regulation transistor. To be more specific, a controlled section of the replica current regulation transistor may be coupled in series with a controlled section of the replica diode-connected transistor.

The feedback circuit may further comprise a compensation capacitor coupled between the supply terminal and the control terminal of the current regulation transistor. As a consequence, the compensation capacitor may also be coupled between the supply terminal and the control terminal of the replica current regulation transistor.

The driver circuit may further comprise a clamp circuit coupled to the control terminal of the regulation transistor. The clamp circuit may be configured to limit the regulation voltage to a threshold voltage. For instance, the clamp circuit may be configured to limit the regulation voltage such that the regulation voltage does not exceed the threshold voltage. At this, the clamp circuit may be configured to not limit or influence the regulation voltage when the regulation voltage is below the threshold voltage, and to limit the regulation voltage to the threshold voltage when the regulation voltage attempts to exceed the threshold voltage. The threshold voltage may or may not be equal to the reference voltage at the input of the error amplifier.

The clamp circuit may comprise a clamp transistor whose controlled section is coupled between the control terminal of the regulation transistor and a reference potential. The clamp circuit may comprise a diode-connected clamp transistor whose control terminal is connected to a control terminal of the clamp transistor. The clamp circuit may comprise a current source coupled in series with a controlled section of diode-connected clamp transistor between the threshold voltage and the reference potential.

According to another aspect, a method of operating a driver circuit is described. The method may comprise steps which correspond to the functional features of the driver circuit described in the present document. More specifically, the described method of operating a driver circuit may generate an output voltage at an output terminal of the driver circuit. The method may comprise coupling a high side switching element between a supply terminal and the output terminal of the driver circuit. The method may comprise coupling a low side switching element between the output terminal of the driver circuit and a reference potential. The method may comprise coupling a controlled section of a regulation transistor in series with the high side switching element and the low side switching element between the supply terminal and the reference potential. The method may comprise regulating, by a feedback circuit, the output voltage by generating a regulation voltage at a control terminal of the regulation transistor.

The coupling the controlled section of the regulation transistor may comprise coupling the controlled section of the regulation transistor between the high side switching element and the output terminal of the driver circuit. The coupling the controlled section of the regulation transistor may comprise coupling the controlled section of the regulation transistor between the output terminal of the driver circuit and the low side switching element.

The method may comprise applying an input voltage of the driver circuit to both a control terminal of the high side switching element and to a control terminal of the low side switching element. The method may comprise regulating, by the feedback circuit, the output voltage of the driver circuit when the high side switching element is turned on.

The method may comprise coupling a controlled section of a replica transistor between the supply terminal and a replica output terminal. The method may comprise generating, by an error amplifier, an error voltage by comparing a voltage at the replica output terminal with a reference voltage.

The method may comprise applying the error voltage to a control terminal of the replica transistor. The method may comprise connecting the control terminal of the replica transistor to the control terminal of the regulation transistor. The replica transistor may have the same geometry as the regulation transistor.

The method may comprise coupling a current source between the output terminal of the driver circuit and the reference potential. Similarly, the method may comprise coupling a replica current source between the replica output terminal and the reference potential.

The method may comprise coupling a compensation capacitor between the control terminal of the regulation transistor and a reference potential.

The method may comprise connecting a control terminal of a diode-connected transistor to the control terminal of the regulation transistor. The method may comprise coupling a current regulation transistor in series with the diode-connected transistor between the supply terminal and the reference potential. The method may comprise applying the error voltage to a control terminal of the current regulation transistor.

The method may comprise connecting a control terminal of a replica diode-connected transistor to the control terminal of the replica regulation transistor. The method may comprise coupling a replica current regulation transistor series with the replica diode-connected transistor between the supply terminal and the reference potential. The method may comprise applying the error voltage to a control terminal of the replica current regulation transistor.

The method may comprise coupling a compensation capacitor between the supply terminal and the control terminal of the current regulation transistor.

The method may comprise coupling a clamp circuit to the control terminal of the regulation transistor. The method may comprise limiting, by the clamp circuit, the regulation voltage to a threshold voltage. The method may comprise coupling a controlled section of a clamp transistor between the control terminal of the regulation transistor and a reference potential. The method may comprise connecting a control terminal of a diode-connected clamp transistor to a control terminal of the clamp transistor. The method may comprise coupling a current source in series with a controlled section of diode-connected clamp transistor between the threshold voltage and the reference potential.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DESCRIPTION

Figure 1:
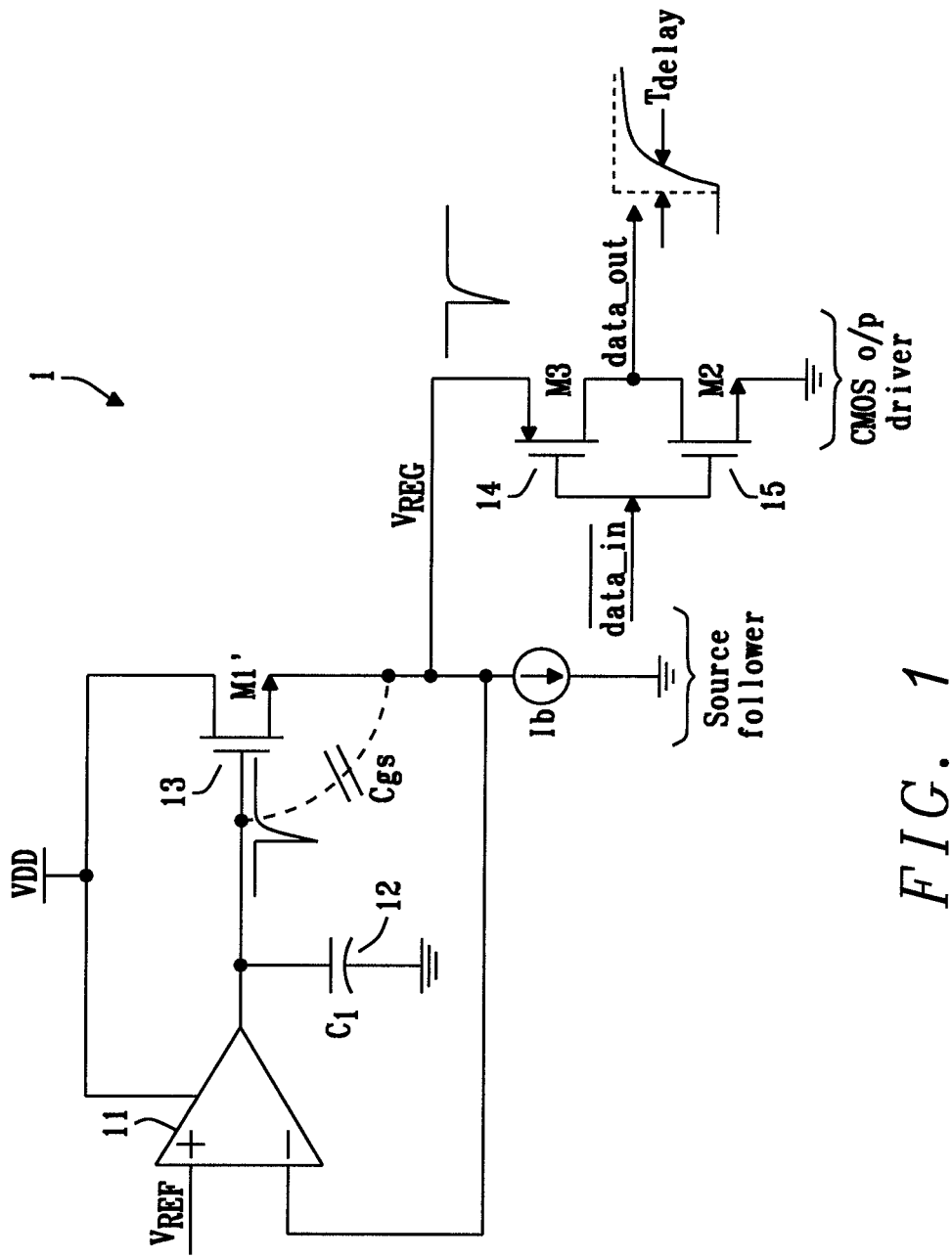
FIG. 1 shows a first exemplary CMOS driver circuit.
Figure 2:
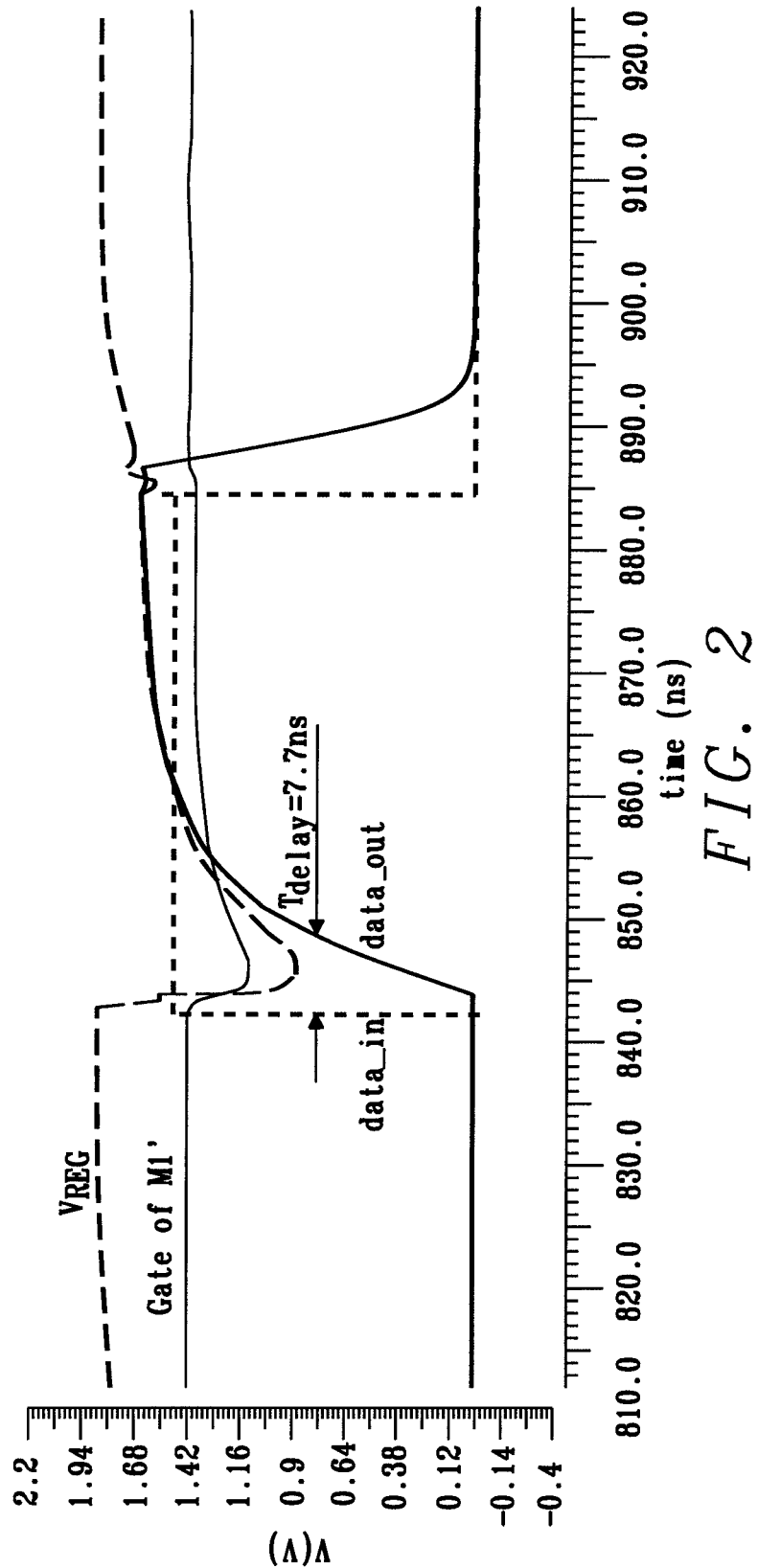
FIG. 2 shows simulation results of the first exemplary CMOS driver circuit displayed in FIG. 1.

CMOS drivers switch very fast and draw tens of milli ampere peak current in a very short duration of nano seconds. FIG. 1 shows a first exemplary CMOS driver circuit 1 using a regulator circuit with a source follower. The source follower has low output impedance for all frequencies and hence provides fast load regulation. An error amplifier 11 compares a reference voltage $V_{REF}$ with the regulated supply voltage $V_{REG}$ of an inverter comprising transistor 14 (high side switching element) and transistor 15 (low side switching element). The circuit is supplied by supply voltage VDD. A regulation transistor 13 is regulating voltage $V_{REG}$ based on the error signal generated by the error amplifier 11. A compensation capacitor 12 is required to introduce a dominant pole at the output of error amplifier 11 to ensure stability of system. As shown in FIG. 1, when the CMOS driver output switches from low to high, voltage $V_{REG}$ drops to a very low value. This negative transient is coupled to the gate of regulation transistor 13 through its large gate-source parasitic capacitance Cgs. Although there is compensation capacitor 12 at the gate of the regulation transistor 13, its capacitance is not high enough to filter this transient significantly. This causes the gate to be pulled low, reducing the current sourcing capacity of regulation transistor 13. Therefore, a drop in voltage $V_{REG}$ causes an increase in rise time of the driver output. This in turn causes a large delay $T_{delay}$ in the driver output switching from low to high. A simulation result in FIG. 2 shows the output of the driver circuit 1 switching from low to high and charging a 50 pF load capacitor. A regulator output drops by 725 mV and the gate of the regulation transistor 13 drops by 250 mV. The measured rise time at the output of the driver circuit is 13 ns. This causes large delay of 7.7 ns between the input signal data_in and the output signal data_out of driver circuit 1.

Figure 3:
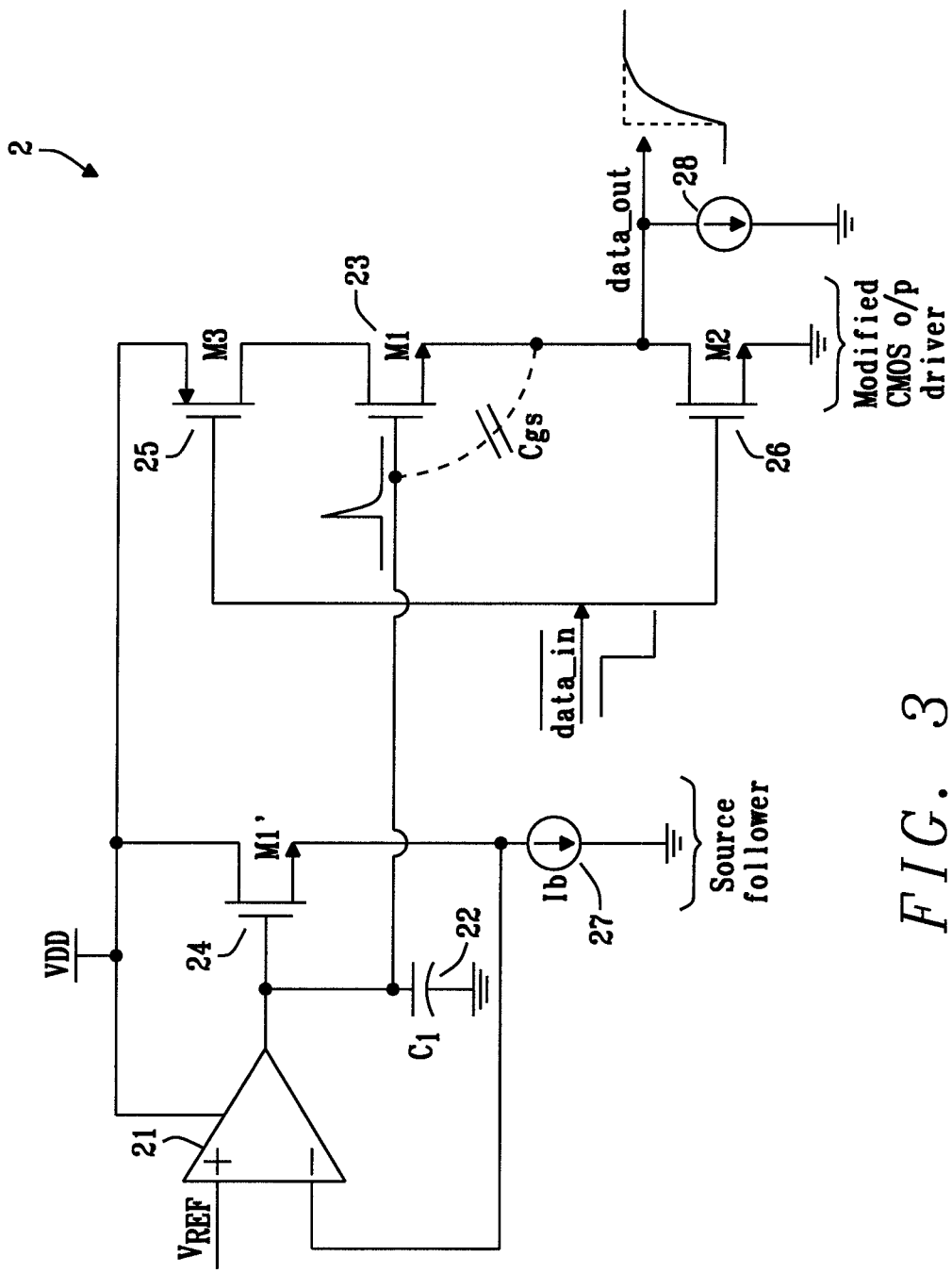
FIG. 3 shows a second exemplary CMOS driver circuit.

FIG. 3 shows a second exemplary CMOS driver circuit 2 which solves the problem of large rise time and delay of driver circuit 1 at least partially. Here a regulation transistor 23 is inserted into the CMOS output driver (denoted as CMOS o/p driver in the figures), i.e. between transistor 25 (high side switching element) and transistor 26 (low side switching element). Moreover, error amplifier 21 now controls the gate of replica transistor 24, where the gate of replica transistor 24 is connected with the gate of regulation transistor 23. Compensation capacitor 22 is again coupled to the error signal generated by the error amplifier 21. The driver circuit 2 further comprises a current source 27 coupled between the source of the replica transistor (i.e. a replica output terminal) and ground. The circuit further comprises a current source 28 coupled between the output terminal of the driver circuit 2 and ground. Both current sources 27, 28 may be configured to draw the same currents from the output terminal and the replica output terminal, respectively.

The modification in FIG. 3 leads to the coupling of a positive transient at the gate of the regulation transistor 23. Hence, the arrangement of the regulation transistor 23 in FIG. 3 makes it possible to turn the negative transient into a positive transient at the gate of the regulation transistor 23. Put in another way, driver circuit 2 now benefits from the formerly disadvantageous transient and the modification rather enhances both rising and falling edges of output signal and reduces delay. Further, the negative feedback loop here serves the purpose of compensating parameter variations of the regulation transistor with respect to process, supply voltage, and temperature (PVT) and bias current. Since replica transistor 24 has the same geometry as regulation transistor 23, and since identical current sources 27, 28 are used, these variations are compensated substantially.

Figure 4:
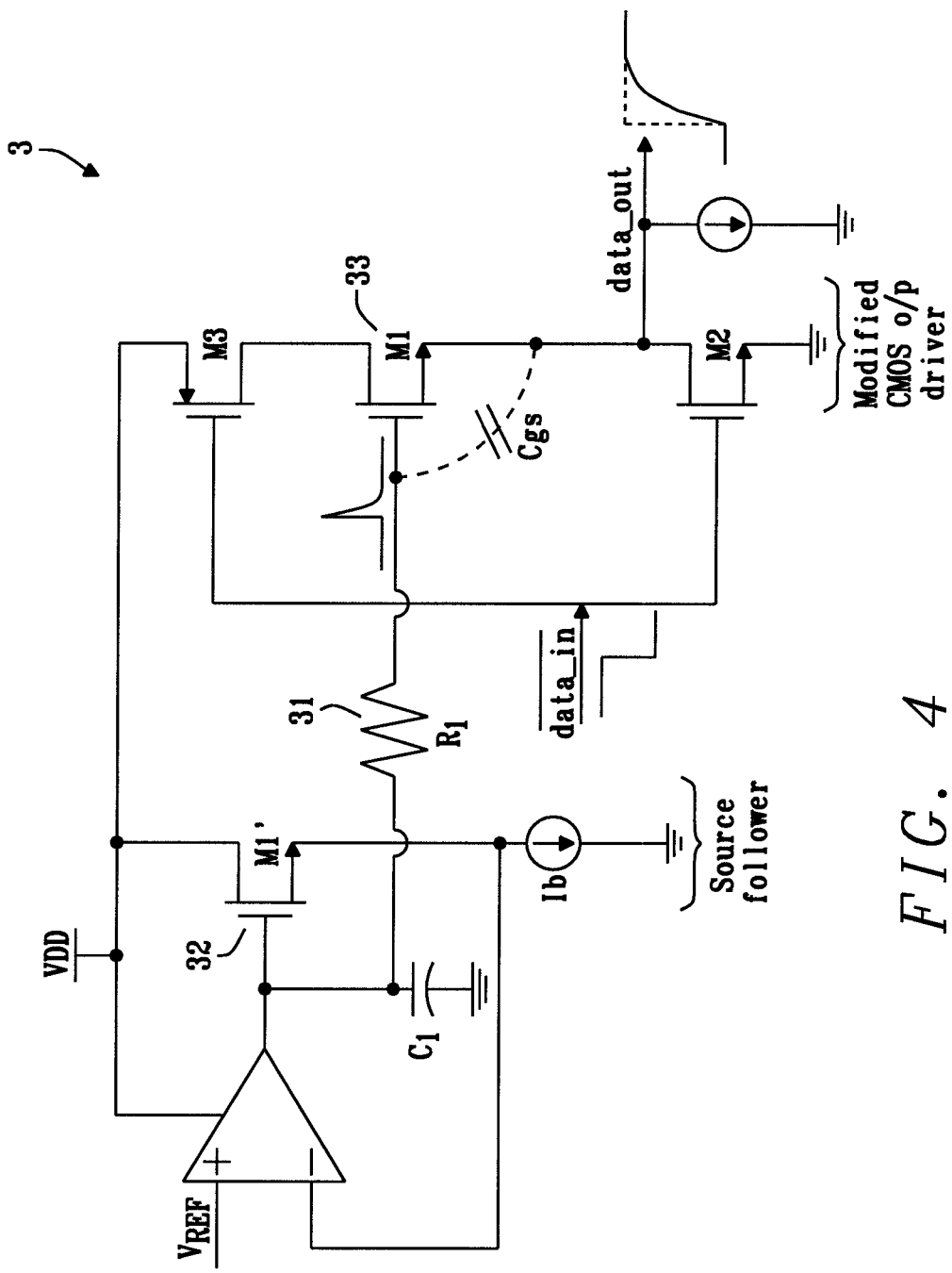
FIG. 4 shows a third exemplary CMOS driver circuit.

FIG. 4 shows a third exemplary CMOS driver circuit 3. The circuit differs from the one shown in FIG. 3 by a resistive element 31 which is may be included between the gates of the replica transistor 32 and regulation transistor 33.

Figure 5:
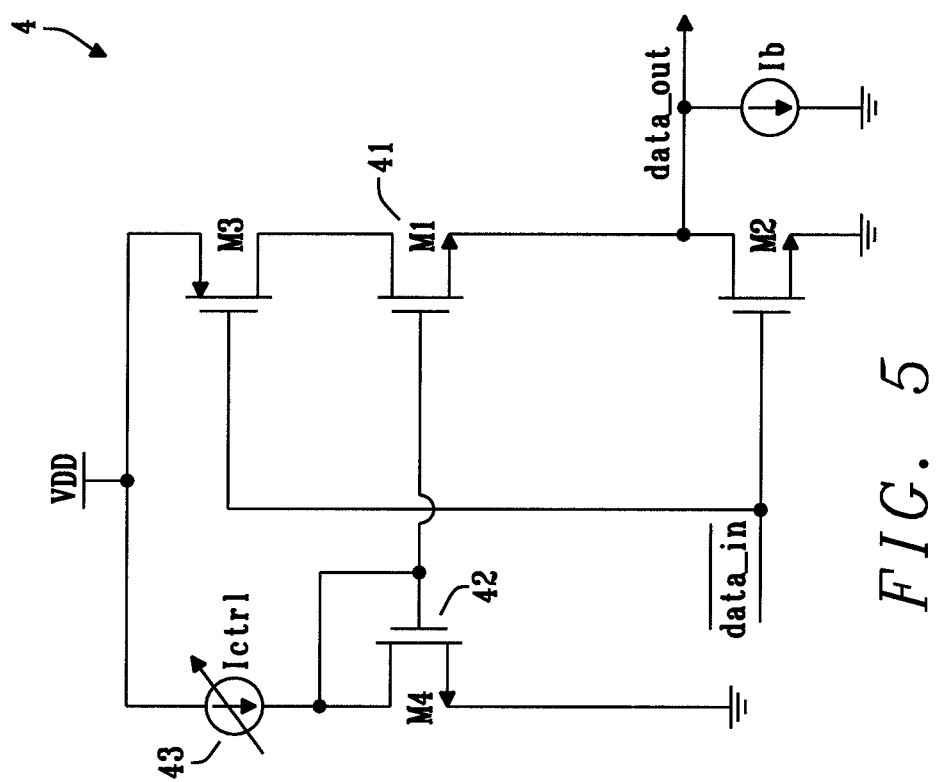
FIG. 5 shows a fourth exemplary CMOS driver circuit.
Figure 6:
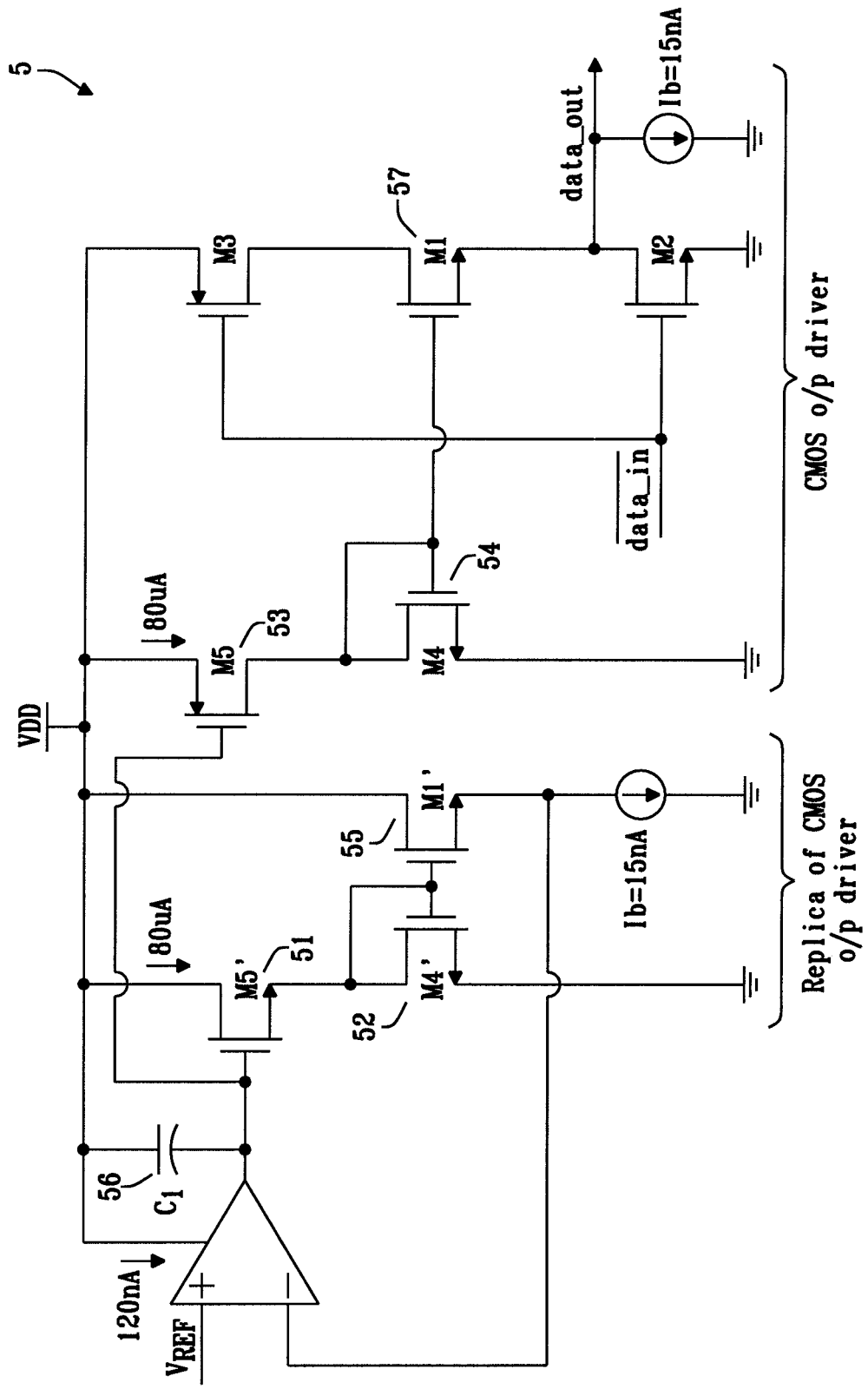
FIG. 6 shows a fifth exemplary CMOS driver circuit.

However, in FIGS. 3 and 4, the compensation capacitor at the gate of the regulation transistor limits the amount of beneficial coupling. A very low capacitance at the gate of the regulation transistor can greatly improve this performance. This leads to further modification to the CMOS driver as shown in FIG. 5. FIG. 5 shows a fourth exemplary CMOS driver circuit 4. Here, the regulation transistor 41 in source follower configuration is driven by a NMOS diode 42 (diode-connected transistor) with smallest possible geometry to keep a low capacitance at the gate of the regulation transistor 41. The current source 43 on top of NMOS diode 42 is controlled e.g. by a negative feedback loop a replica transistor as shown in FIG. 6. Again, the replica of the CMOS driver undergoes the same parameter variations as CMOS driver itself with respect to process, temperature, supply, and bias conditions.

In particular, FIG. 6 shows a fifth exemplary CMOS driver circuit 5. In addition to the circuit elements discussed with regard to the previous figures, driver circuit 5 comprises on the replica side: a replica diode-connected transistor 52 whose gate is connected to the gate of the replica regulation transistor 55, a replica current regulation transistor 51 coupled in series with the replica diode-connected transistor 52 between the supply voltage VDD and ground, and the replica transistor 55. The error voltage is applied to a control terminal of the replica current regulation transistor 51. This time, the compensation capacitor 56 is connected between the error voltage and the supply voltage VDD to improve the power supply rejection ratio (PSSR).

Furthermore, driver circuit 5 comprises a diode-connected transistor 54 whose gate is connected to the gate of the regulation transistor 57, and a current regulation transistor 53 coupled in series with the diode-connected transistor 54 between the supply voltage VDD and the reference potential. Again, the error voltage is applied to a control terminal of the current regulation transistor 53.

Figure 7:
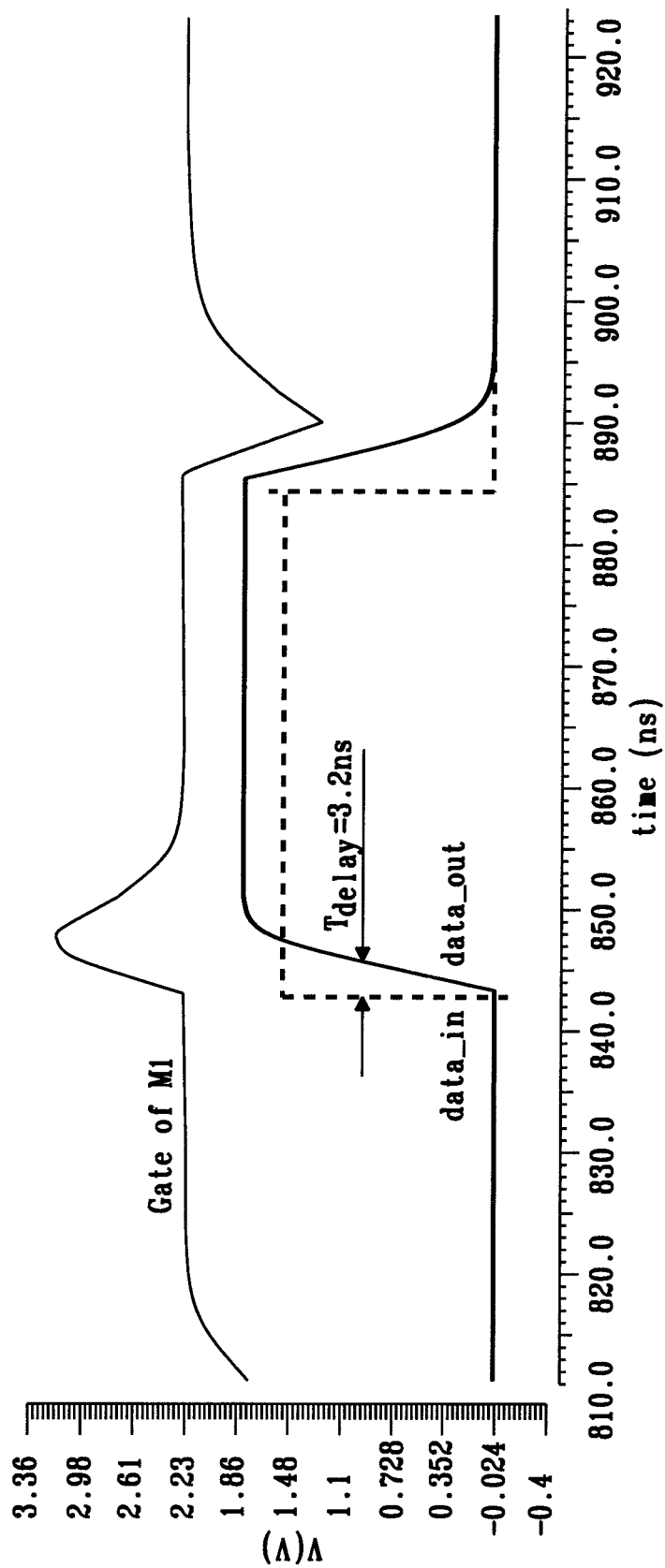
FIG. 7 shows simulation results of the fifth exemplary CMOS driver circuit displayed in FIG. 6.

FIG. 7 shows simulation results of the fifth exemplary CMOS driver circuit of FIG. 6. Compared to alternative implementations, the delay is substantially reduced to $T_{delay}$=3.2 ns.

The architecture in FIG. 6 is designed to meet the MIPI SPMI specification and is simulated with a 50 pF driver load capacitance. The average current of the CMOS driver is 1.4 mA. The DC quiescent current consumption of the proposed architecture is 160.15 uA. This may be acceptable because it is a very small fraction of its average current. Moreover, there might be more than 1-instance of SPMI or may have several other IOs like GPIO. They all can share same replica driver and the biasing circuitry improving overall power efficiency.

Figure 8:
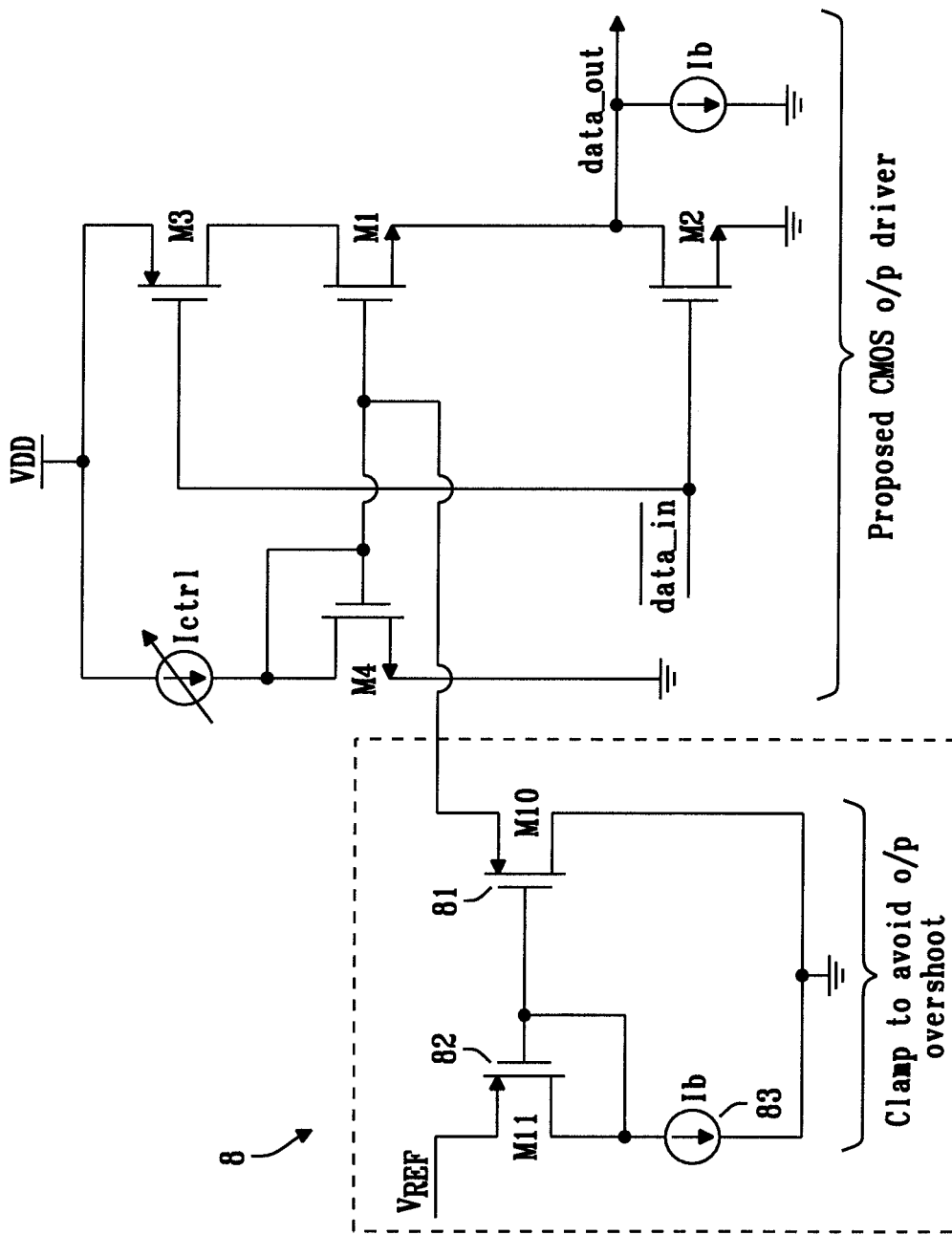
FIG. 8 shows the fourth exemplary CMOS driver circuit of FIG. 5 with an additional clamp circuit.

FIG. 8 shows the fourth exemplary CMOS driver circuit of FIG. 5 with an additional clamp circuit 8. Clamp circuit 8 may be coupled to the gate of the regulation transistor of any driver circuit presented in this document. Clamp circuit 8 may be configured to limit the regulation voltage at the gate of the regulation transistor to a threshold voltage.

The exemplary clamp circuit 8 may comprise a clamp transistor 81 whose controlled section is coupled between the control terminal of the regulation transistor and a reference potential. The clamp circuit 8 comprises a diode-connected clamp transistor 82 whose control terminal is connected to a control terminal of the clamp transistor 81. The clamp circuit 8 comprises a current source 83 coupled in series with a controlled section of diode-connected clamp transistor 82 between the threshold voltage Vref and ground. Clamp circuit 8 may avoid an excessive VOH overshoot.

In summary, the proposed driver circuits may eliminate the need of dedicated internal supply rails or regulators with large off-chip capacitor for CMOS drivers like GPIOs, SPMI. The proposed driver circuits may use a NMOS or PMOS transistors as regulation devices inserted in a CMOS driver. These regulation devices may act as source follower when the driver output is high. Further replica drivers with negative feedback loops are presented to overcome PVT variations.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A driver circuit configured to generate an output voltage at an output terminal of the driver circuit, the driver circuit comprising
   a high side switching element coupled between a supply terminal and the output terminal of the driver circuit,
   a low side switching element coupled between the output terminal of the driver circuit and a reference potential,
   a regulation transistor, wherein a controlled section of the regulation transistor is coupled in series with the high side switching element and the low side switching element between the supply terminal and the reference potential, and
   a feedback circuit configured to regulate the output voltage by generating a regulation voltage at a control terminal of the regulation transistor,
   wherein an input voltage of the driver circuit is applied to both a control terminal of the high side switching element and to a control terminal of the low side switching element.

2. The driver circuit according to claim 1, wherein the controlled section of the regulation transistor is coupled
   between the high side switching element and the output terminal of the driver circuit, or
   between the output terminal of the driver circuit and the low side switching element.

3. The driver circuit according to claim 1, wherein the feedback circuit is configured to regulate the output voltage when the high side switching element is turned on.

4. The driver circuit according to claim 1, wherein the feedback circuit comprises
   a replica transistor, wherein a controlled section of the replica transistor is coupled between the supply terminal and a replica output terminal, and
   an error amplifier configured to generate an error voltage by comparing a voltage at the replica output terminal with a reference voltage.

5. The driver circuit according to claim 4, wherein the error voltage is applied to a control terminal of the replica transistor, and wherein the control terminal of the replica transistor is connected to the control terminal of the regulation transistor.

6. The driver circuit according to claim 4, wherein the replica transistor has the same geometry as the regulation transistor.

7. The driver circuit according to claim 4, wherein the driver circuit further comprises a current source coupled between the output terminal of the driver circuit and the reference potential, and wherein the feedback circuit further comprises a replica current source coupled between the replica output terminal and the reference potential.

8. The driver circuit according to claim 4, wherein the feedback circuit further comprises
   a diode-connected transistor whose control terminal is connected to the control terminal of the regulation transistor, and
   a current regulation transistor coupled in series with the diode-connected transistor between the supply terminal and the reference potential, wherein the error voltage is applied to a control terminal of the current regulation transistor.

9. The driver circuit according to claim 8, wherein the feedback circuit further comprises
   a replica diode-connected transistor whose control terminal is connected to the control terminal of the replica regulation transistor, and
   a replica current regulation transistor coupled in series with the replica diode-connected transistor between the supply terminal and the reference potential, wherein the error voltage is applied to a control terminal of the replica current regulation transistor.

10. The driver circuit according to claim 8, wherein the feedback circuit further comprises
    a compensation capacitor coupled between the supply terminal and the control terminal of the current regulation transistor.

11. The driver circuit according to claim 1, further comprising a clamp circuit coupled to the control terminal of the regulation transistor, wherein the clamp circuit is configured to limit the regulation voltage to a threshold voltage.

12. The driver circuit according to claim 11, wherein the clamp circuit comprises
    a clamp transistor whose controlled section is coupled between the control terminal of the regulation transistor and a reference potential,
    a diode-connected clamp transistor whose control terminal is connected to a control terminal of the clamp transistor, and
    a current source coupled in series with a controlled section of diode-connected clamp transistor between the threshold voltage and the reference potential.

13. A driver circuit configured to generate an output voltage at an output terminal of the driver circuit, the driver circuit comprising
    a high side switching element coupled between a supply terminal and the output terminal of the driver circuit,
    a low side switching element coupled between the output terminal of the driver circuit and a reference potential,
    a regulation transistor, wherein a controlled section of the regulation transistor is coupled in series with the high side switching element and the low side switching element between the supply terminal and the reference potential, and
    a feedback circuit configured to regulate the output voltage by generating a regulation voltage at a control terminal of the regulation transistor,
    wherein the feedback circuit comprises
    a replica transistor, wherein a controlled section of the replica transistor is coupled between the supply terminal and a replica output terminal, and
    an error amplifier configured to generate an error voltage by comparing a voltage at the replica output terminal with a reference voltage, and
    wherein the feedback circuit further comprises
    a compensation capacitor coupled between the control terminal of the regulation transistor and a reference potential.

14. A method of operating a driver circuit for generating an output voltage at an output terminal of the driver circuit, the method comprising
    coupling a high side switching element between a supply terminal and the output terminal of the driver circuit,
    coupling a low side switching element between the output terminal of the driver circuit and a reference potential,
    coupling a controlled section of a regulation transistor in series with the high side switching element and the low side switching element between the supply terminal and the reference potential, and
    regulating, by a feedback circuit, the output voltage by generating a regulation voltage at a control terminal of the regulation transistor, wherein applying an input voltage of the driver circuit to both a control terminal of the high side switching element and to a control terminal of the low side switching element.

15. The method according to claim 14, wherein coupling the controlled section of the regulation transistor comprises
coupling the controlled section of the regulation transistor between the high side switching element and the output terminal of the driver circuit, or
coupling the controlled section of the regulation transistor between the output terminal of the driver circuit and the low side switching element.

16. The method according to claim 14, comprising
regulating, by the feedback circuit, the output voltage of the driver circuit when the high side switching element is turned on.

17. The method according to claim 14, comprising
coupling a controlled section of a replica transistor between the supply terminal and a replica output terminal, and
generating, by an error amplifier, an error voltage by comparing a voltage at the replica output terminal with a reference voltage.

18. The method according to claim 17, comprising
applying the error voltage to a control terminal of the replica transistor, and
connecting the control terminal of the replica transistor to the control terminal of the regulation transistor.

19. The method according to claim 17, wherein the replica transistor has the same geometry as the regulation transistor.

20. The method according to claim 17, comprising
coupling a current source between the output terminal of the driver circuit and the reference potential, and
coupling a replica current source between the replica output terminal and the reference potential.

21. The method according to claim 17, comprising
connecting a control terminal of a diode-connected transistor to the control terminal of the regulation transistor,
coupling a current regulation transistor in series with the diode-connected transistor between the supply terminal and the reference potential, and
applying the error voltage to a control terminal of the current regulation transistor.

22. The method according to claim 21, comprising
connecting a control terminal of a replica diode-connected transistor to the control terminal of the replica regulation transistor,
coupling a replica current regulation transistor series with the replica diode-connected transistor between the supply terminal and the reference potential, and applying the error voltage to a control terminal of the replica current regulation transistor.

23. The method according to claim 21, comprising
coupling a compensation capacitor between the supply terminal and the control terminal of the current regulation transistor.

24. The method according to claim 14, comprising
coupling a clamp circuit to the control terminal of the regulation transistor, and
limiting, by the clamp circuit, the regulation voltage to a threshold voltage.

25. The method according to claim 24, comprising
coupling a controlled section of a clamp transistor between the control terminal of the regulation transistor and a reference potential,
connecting a control terminal of a diode-connected clamp transistor to a control terminal of the clamp transistor, and
coupling a current source in series with a controlled section of diode-connected clamp transistor between the threshold voltage and the reference potential.

26. A method of operating a driver circuit for generating an output voltage at an output terminal of the driver circuit, the method comprising
coupling a high side switching element between a supply terminal and the output terminal of the driver circuit,
coupling a low side switching element between the output terminal of the driver circuit and a reference potential,
coupling a controlled section of a regulation transistor in series with the high side switching element and the low side switching element between the supply terminal and the reference potential, and
regulating, by a feedback circuit, the output voltage by generating a regulation voltage at a control terminal of the regulation transistor,
wherein the method further comprises
coupling a controlled section of a replica transistor between the supply terminal and a replica output terminal, and
generating, by an error amplifier, an error voltage by comparing a voltage at the replica output terminal with a reference voltage, and
wherein the method further comprises
coupling a compensation capacitor between the control terminal of the regulation transistor and a reference potential.

* * * * *